(12) United States Patent
Song et al.

(10) Patent No.: US 7,800,325 B2
(45) Date of Patent: Sep. 21, 2010

(54) BRUSHLESS DC MOTOR USING LINEAR HALL-EFFECT SENSOR AND REALIZATION METHOD OF SPEED SIGNAL THEREOF

(75) Inventors: Chi-Young Song, Deajeon-si (KR); Jeong-Hoi Gu, Daejeon-si (KR)

(73) Assignee: Agency for Defense Development (KR)

( * ) Notice: Subject to any disclaimer, the term of this patent is extended or adjusted under 35 U.S.C. 154(b) by 381 days.

(21) Appl. No.: 11/943,002

(22) Filed: Nov. 20, 2007

(65) Prior Publication Data
US 2008/0272765 A1    Nov. 6, 2008

(30) Foreign Application Priority Data
May 3, 2007    (KR) ...................... 10-2007-0042956

(51) Int. Cl.
*H02P 21/00*    (2006.01)
(52) U.S. Cl. ..................... 318/400.02; 318/400.01; 318/700
(58) Field of Classification Search ............ 318/400.01, 318/400.02, 700; 324/173
See application file for complete search history.

(56) References Cited

U.S. PATENT DOCUMENTS

| | | | |
|---|---|---|---|
| 6,411,081 B1 * | 6/2002 | Spellman | 324/207.21 |
| 6,650,073 B2 * | 11/2003 | Kawabata | 318/400.14 |
| 6,670,806 B2 * | 12/2003 | Wendt et al. | 324/207.24 |
| 6,739,212 B2 * | 5/2004 | Flynn | 74/512 |
| 6,815,861 B2 * | 11/2004 | Suzuki et al. | 310/216.101 |
| 7,250,754 B2 * | 7/2007 | Godkin | 324/207.24 |

* cited by examiner

*Primary Examiner*—Bentsu Ro
*Assistant Examiner*—David S Luo
(74) *Attorney, Agent, or Firm*—Banner & Witcoff, Ltd.

(57) ABSTRACT

Disclosed is a realization method of a speed signal of a motor using a linear Hall-effect sensor that may include the steps of: determining coordinate values on a x-y coordinate system using a Hall signal in the form of a sine wave of a linear Hall-effect sensor, evaluating a summed coordinate value of the above coordinate values, calculating the angle (θ) formed by a summed coordinate value and the x axis; determining the quadrant of the resulted angle (θ), and determining a speed signal by dividing the final motor displacement value by the rate of time change.

6 Claims, 10 Drawing Sheets

[FIG. 2]
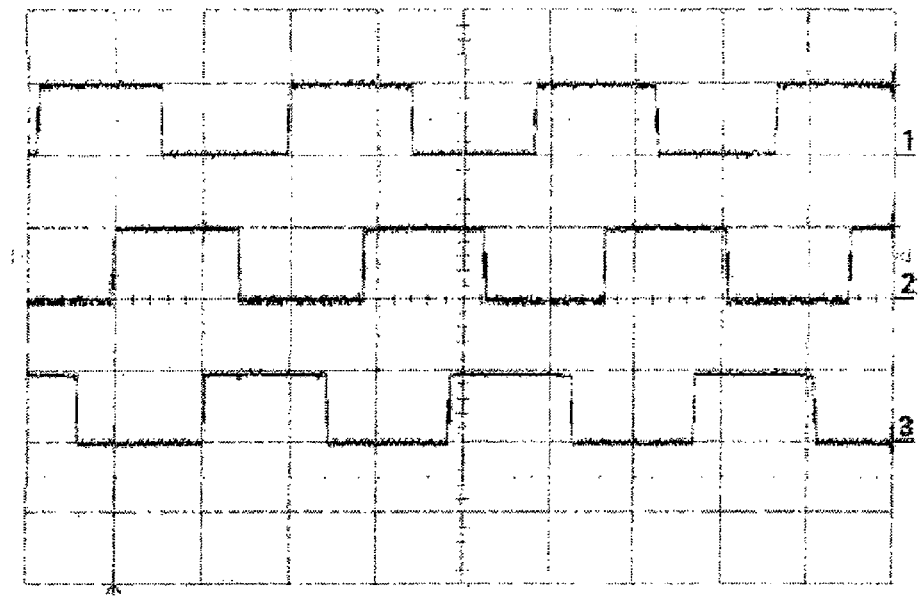
<Output Waveforms of Latch Hall Effect Sensor>
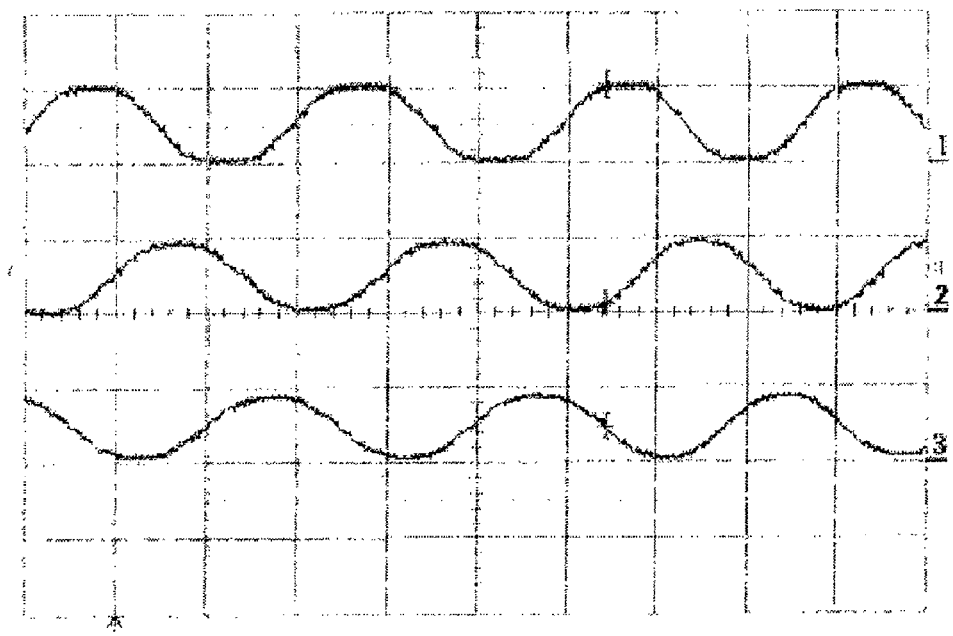
<Output Waveforms of Linear Hall Effect Sensor>

[FIG. 3]
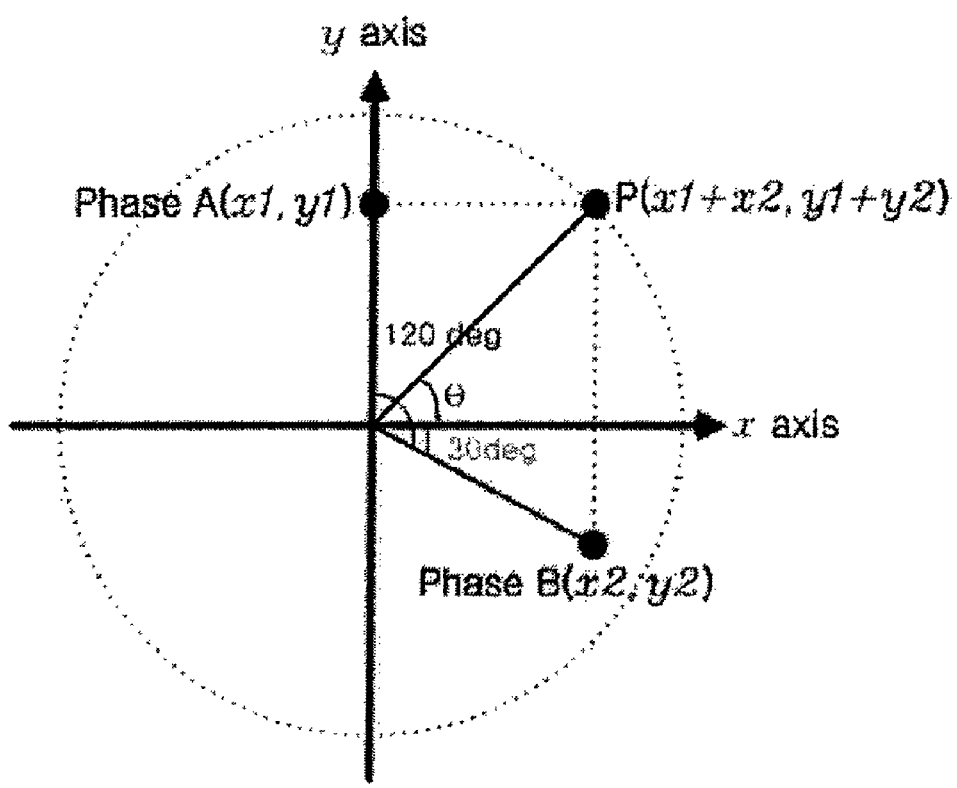

[FIG. 4]
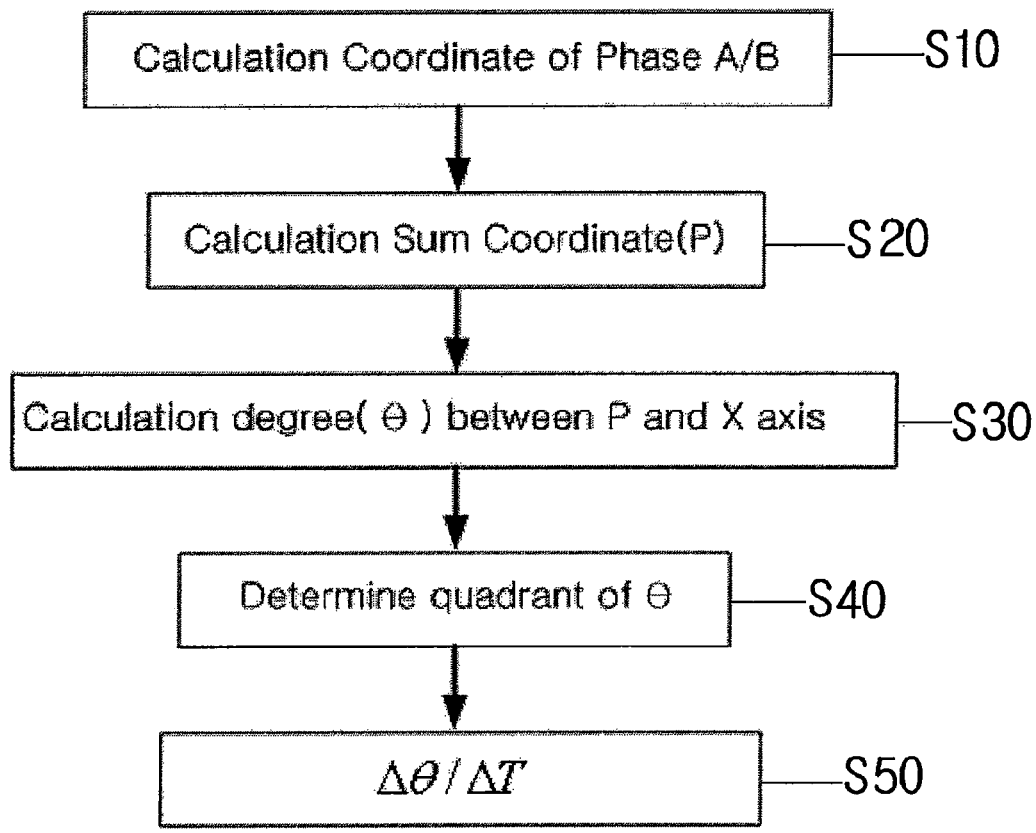

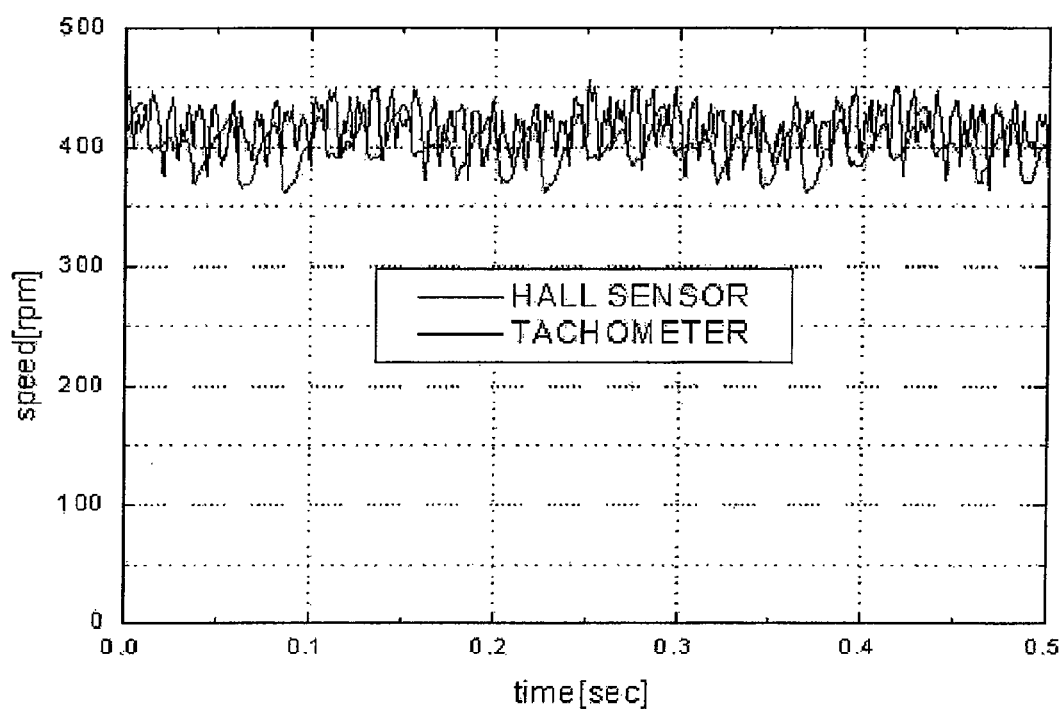
[FIG. 5]

[FIG. 6]
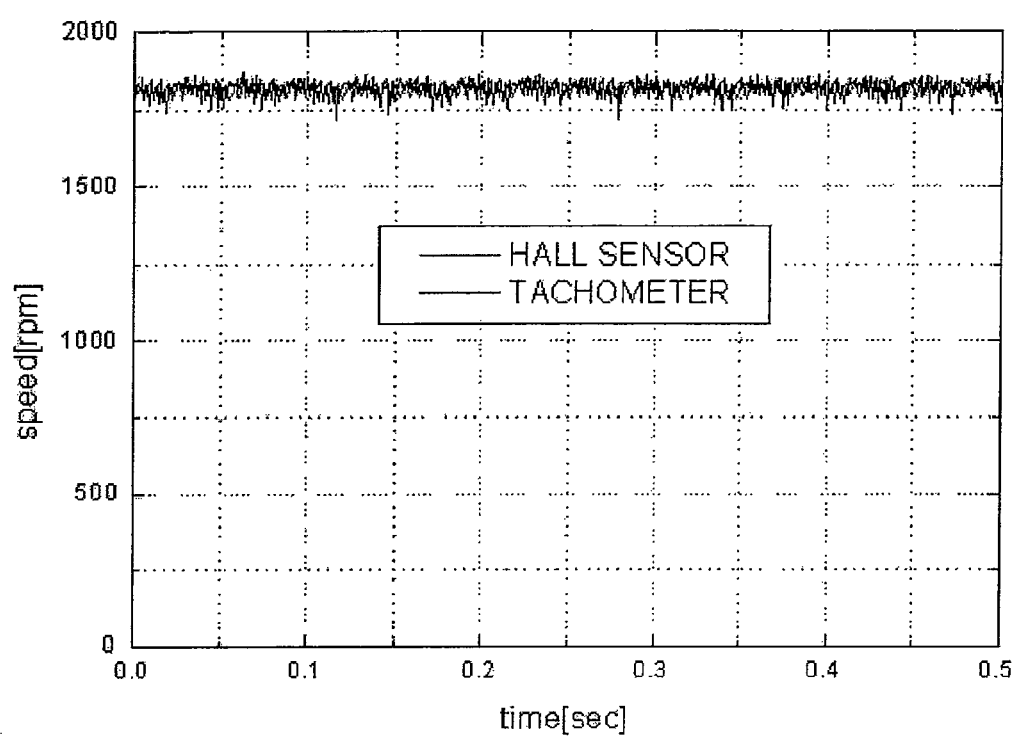

[FIG. 7]
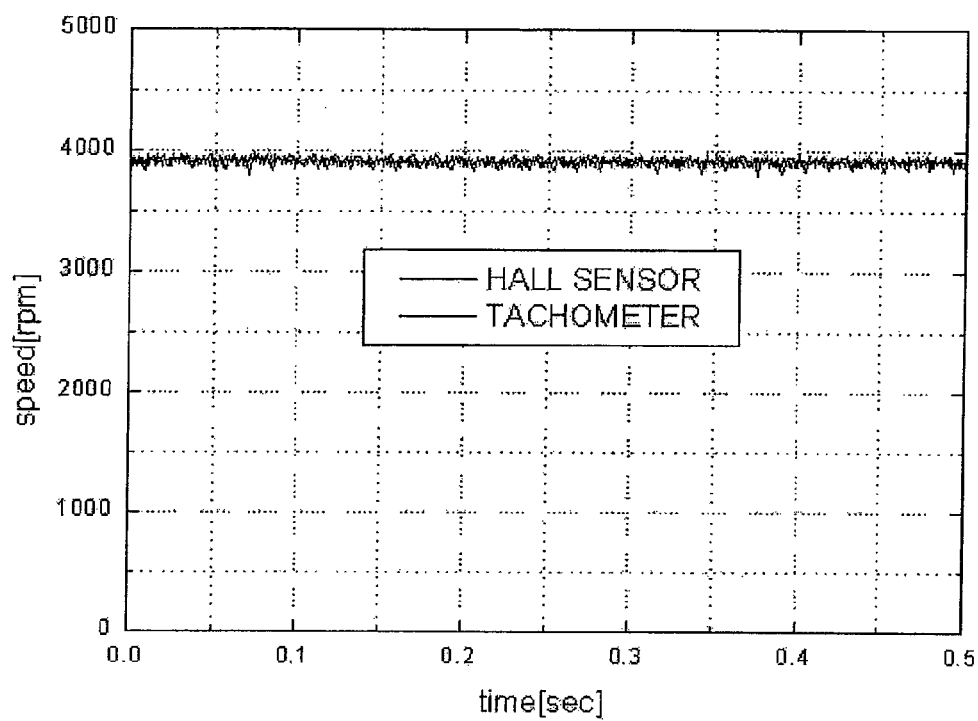

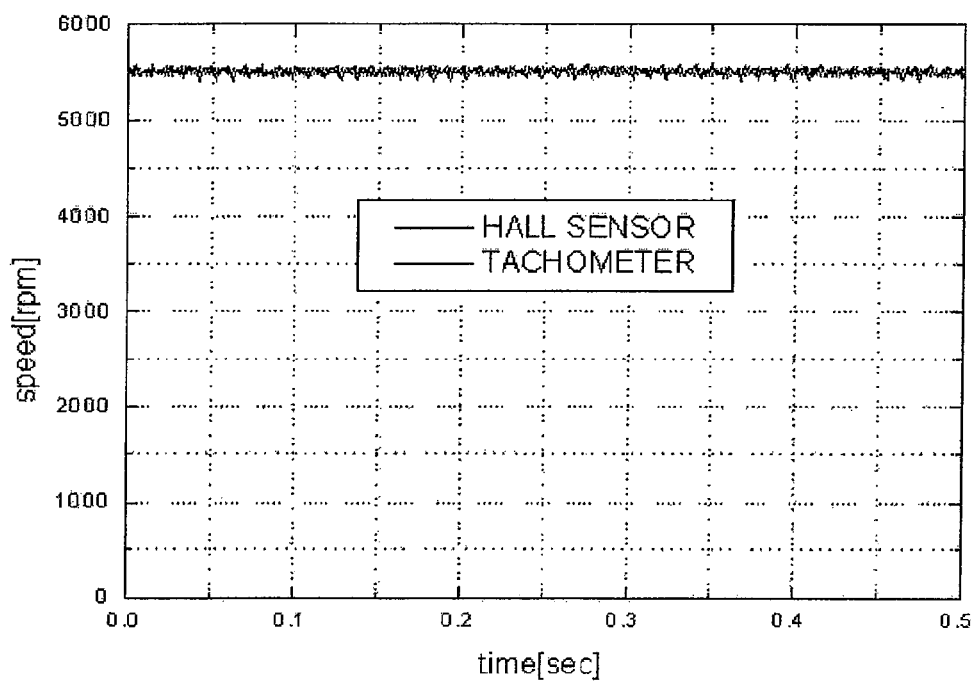
[FIG. 8]

[FIG. 9]
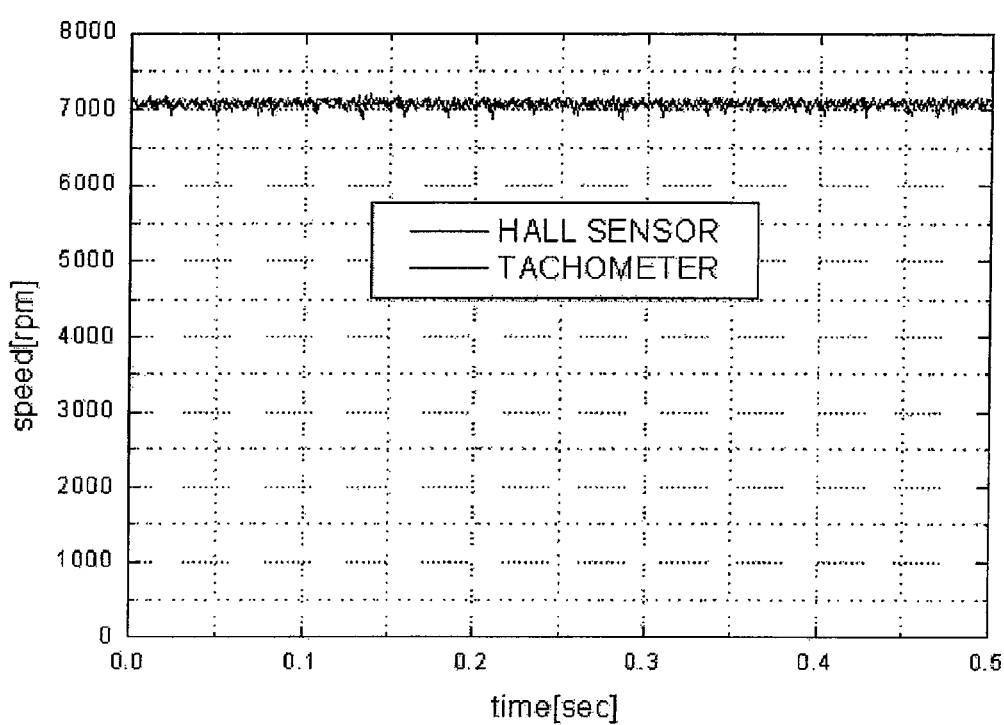

[FIG. 10]
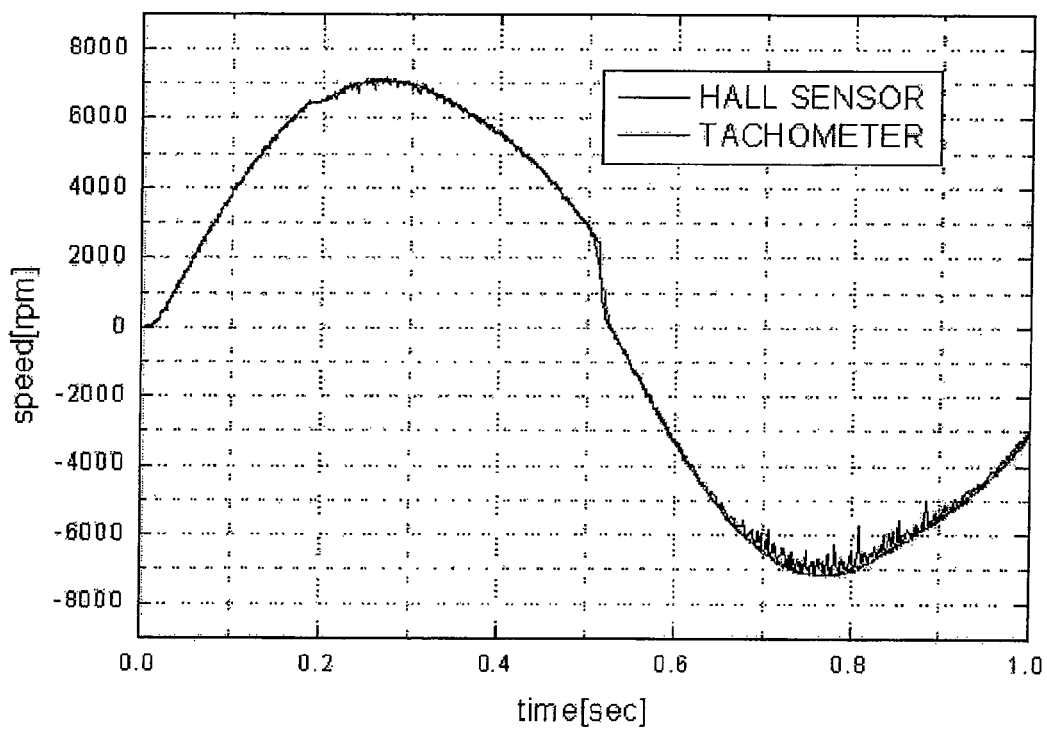

BRUSHLESS DC MOTOR USING LINEAR HALL-EFFECT SENSOR AND REALIZATION METHOD OF SPEED SIGNAL THEREOF

BRIEF DESCRIPTION OF THE DRAWINGS

FIG. 2 is graphs comparing the output waveforms of a conventional latch-type Hall-effect sensor and a linear Hall-effect sensor of the present invention;

FIG. 3 is a concept view for representing the output value of a linear Hall-effect sensor of the present invention as a coordinate value on a two-dimensional plane;

FIG. 4 is a flow chart showing an algorithm embodying the rotation speed signal of a motor by using a linear Hall-effect sensor of the present invention; and FIGS. 5 to 10 represent the test results wherein a linear Hall-effect sensor of the present invention is applied in the test.

Figure 1:
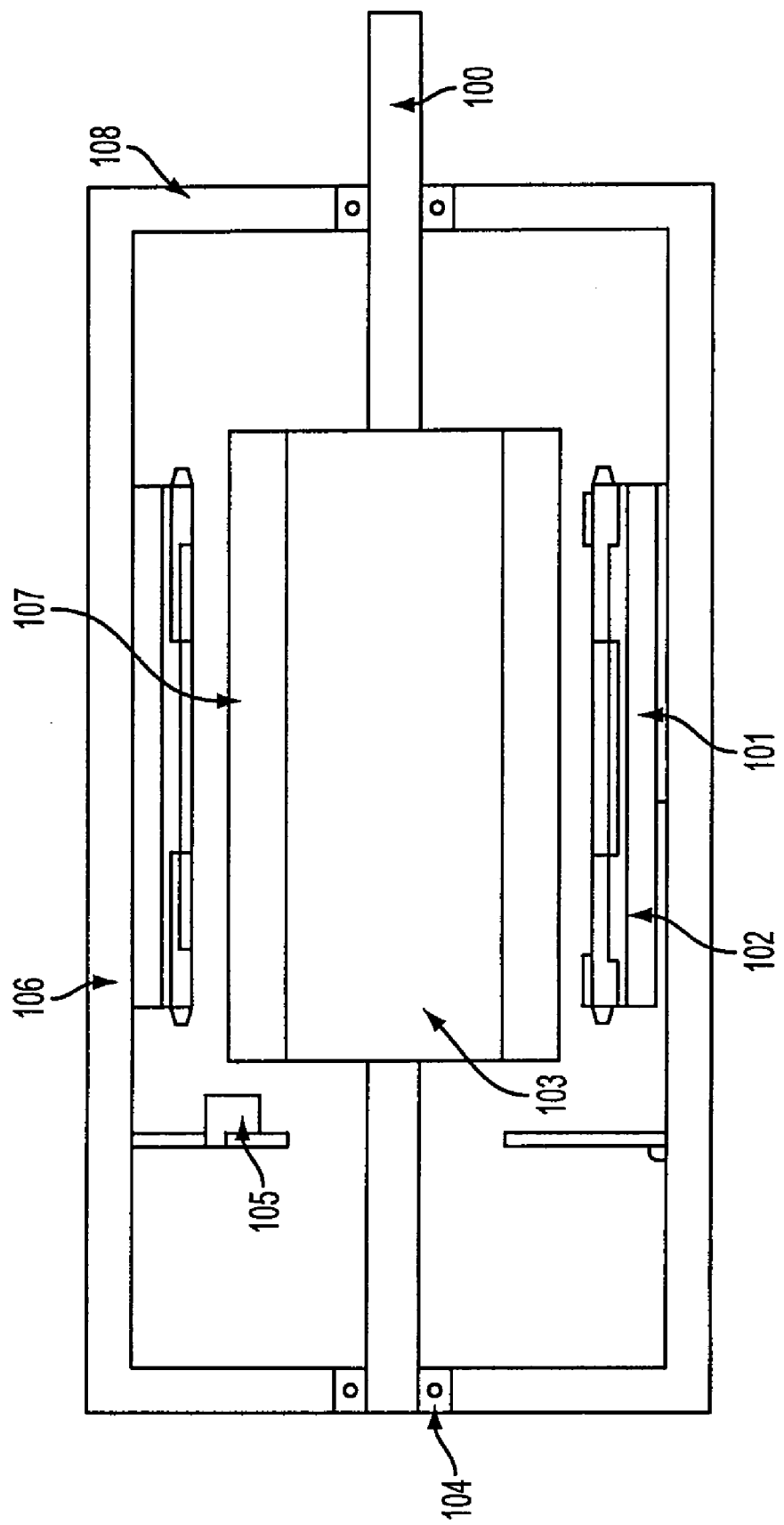
FIG. 1 illustrates the structure of a general BLDC motor.

Numerals Used in Main Parts of Drawings

| | |
|---|---|
| 100: shaft | 101: stator |
| 102: armature coil | 103: motor yoke |
| 104: ball bearing | 105: Hall-effect sensor |
| 106: stator yoke | 107: magnet |
| 108: bearing bracket | |

BACKGROUND OF THE INVENTION

The present invention relates to a brushless DC motor and a realization method of speed signal thereof, using a linear Hall-effect sensor which can measure the speed of a brushless DC (Direct current: referred as BLDC) motor without using a speed sensor so as to reduce the volume of a control system and cost. Specifically, the present invention uses a linear Hall-effect sensor instead of a conventional latch type Hall-effect sensor, for generating a commutation signal and speed signal of a BLDC motor. Therefore, it becomes possible to eliminate a separate speed sensor generally equipped in a conventional BLDC motor and naturally, to exclude the possibility of a sensor failure, thereby ensuring more space and higher reliability.

In many cases of servomotor operation, a speed sensor is used for detecting a speed signal. The problem of such type of design is that additional space is required for installing a motor and a speed sensor. However, in many cases, there is no enough space for installing such speed sensor, and otherwise, it increases cost owing to such installation of two separate parts. For solving the problems, some approaches to eliminate a speed sensor have been proposed. Typical approaches for acquiring speed information without using speed sensor are counting the pulse of latched Hall-effect sensor and using mathematical observer.

A method for counting a Hall-effect sensor signal, which is useful in a higher speed range where pulses periodically occur, can accept quantization error and dynamic range in measuring speed. In the meantime, this technique does not work well in a lower speed range. In a technical field regarding, for example, a position control system, a motor operates over a wide speed range from standstill to the maximum acceptable speed. Think of an extreme case in which a motor rotates at a low speed so as to generate only one pulse during a certain time period. When the speed is gradually raised until two pulses are observed, the estimated speed will be twice as much as the previous case. In this case, quantization error will be nearly 100%. The utilization of smoothing algorithm may be helpful, however, the fundamental problem cannot be overcome. Other techniques which can eliminate a speed sensor are based on an observer. However, since such techniques are established by a mathematical equation of an electric motor, they are very sensitively affected by parameters of such electric motor. Specifically, the methods are easily affected by non-linear elements such as dead zone, backlash or the like, which makes a stable speed signal measure difficult.

More specifically, although a tachometer, an encoder or the like are generally used for obtaining information on a speed signal of a motor, such sensors requires additional space for being linked to the motor, thereby being disadvantageous in terms of space efficiency. Particularly, for example, contact-type sensors could cause a system failure owing to corrosion between the contact areas. By such reason, elimination of such speed sensor has been demanded, and thus various related studies have been done as well as underway.

For instance, a method using an observer which can estimate the speed of a motor by using software, can be mentioned. However, such method has problems such as limitation on gain selection for determining dynamic characteristics of observation device errors and re-constructional errors in connection with unreliability at low frequency. Therefore, when it is applied to a control system such as a fin actuator of a guided missile, it gets easily affected by disturbances and parameter variations, thereby having limitations on achieving excellent system performance and stability. As other methods, as it has been described in the forgoing description, there are M mode, T mode, M/T mode or the like which use a pulse clock number of a Hall-effect sensor in order to obtain place information of a magnetic pole of BLDC motor. Since a new speed value is calculated only at the time of pulse generation, at high speed in which pulses are sufficiently occurred, this method can realize the rotation speed of a motor by counting the clock number by pulses generated over a certain period of time. However, it has a problem that when a motor rotates at low speed, there may be an area without pulse generation within a certain time set, causing a phase lag. It means that, since a Hall-effect sensor has a small number of pulse clocks, reliable speed information of a motor can be obtained at high speed, however at low speed, phase lag and wrong speed signals are obtained. Therefore, this method is not suitable for being applied to a system which is operated over a wide range of a motor speed.

SUMMARY OF THE INVENTION

The present invention has been designed to solve such problems in conventional arts, having following objects. The first object of the present invention is to provide a brushless DC motor using a linear Hall-effect sensor which can be applied to a motor-driven system with a narrow development space, by eliminating a speed sensor and thus ensuring a development space as well as to provide a realization method of a motor signal.

The second object of the present invention is to provide a brushless DC motor using a linear Hall-effect sensor which can be applied to a BLDC motor for high-speed use by using a non-contact type sensor, and achieve perfect realization of speed signal even at lower speed, thereby being possible to detect a speed over a wide speed range, and to provide a realization method of a speed signal.

The third object of the present invention is to make it possible to realize of speed signal with high reliability as compared to a conventional tachometer which has been mainly used for obtaining speed information. In a tachometer, there are some cases wherein the sensitivity of a sensor changes according to the state of contact between a brush and a commutator, owing to the variance of contact resistance generated from such contact between a brush which has the same structure with that of a DC motor and a commutator. However, according to the present invention, provided are a brushless DC motor which uses a linear Hall-effect sensor so as to ensure higher reliability, and a realization method of speed signal of such motor, owing to the realization of a speed signal by using a linear Hall-effect sensor which is a non-contact type sensor and varies its output voltage depending on the intensity of a surrounding magnetic field.

DETAILED DESCRIPTION OF THE INVENTION

According to the present invention, provided is a brushless DC motor comprising a shaft, a stator, an armature coil, a rotor yoke, a ball bearing, a Hall-effect sensor, a stator yoke, a magnet and a bearing bracket, characterized in that the Hall-effect sensor is a linear Hall-effect sensor.

According to the present invention, provided is a realization method of speed signal of a motor using a linear Hall-effect sensor, characterized by comprising the steps of: by using a Hall signal in the form of a sine wave of a linear Hall-effect sensor, determining coordinate values on a x-y coordinate system of the position sensor; evaluating a summed coordinate value of the above coordinate values; calculating the angle ($\theta$) formed by a summed coordinate value and the x axis; determining the quadrant of the resulted angle ($\theta$); and determining a speed signal by dividing the final motor displacement value by the rate of time change.

Hereinafter, a device and a method according to one embodiment of the present invention are further described with referencing to the drawings attached hereto.

FIG. 1 is a structure of a general BLDC motor.

In the figure, 100 is a shaft; 101 is a stator; 102 is an armature coil; 103 is a motor yoke; 104 is a ball bearing; 105 is a Hall-effect sensor; 106 is a stator yoke; 107 is a magnet; and 108 is a bearing bracket.

The present invention also discloses an algorithm for realizing the speed signal of a motor by replacing a conventional latch type Hall-effect sensor, which is a sensor for detecting the polarity of a magnet and has been essentially used for the operation of a BLDC, with a linear Hall-effect sensor. Hence, it becomes possible to generate an operation signal for motor operation, as well as to obtain position information of a rotor in a motor and speed signal information. Further, by applying a linear Hall-effect sensor, other changes in magnetic field depending on displacement of a rotor can be detected, and the detected changes are outputted as a voltage. Additionally, for compatible use in other circuits driven by a conventional BLDC motor, the present invention can generate the same operation signals with the output of a conventional latch type Hall-effect sensor.

FIG. 2 is graphs comparing the output waveforms of a conventional latch-type Hall-effect sensor and a linear Hall-effect sensor of the present invention. As it can be seen from the figure, the output waveform of a conventional latch-type Hall-effect sensor is a square wave, while that of a linear Hall-effect sensor of the present invention is a sine wave.

FIG. 3 is a concept view for representing the output value of a linear Hall-effect sensor as a coordinate value on a two-dimensional plane. As being illustrated, from the Hall signal ($h_A$, $h_B$, $h_C$) in the form of a sine wave as shown in FIG. 2, A phase coordinate value ($x_1$, $y_1$) and B phase coordinate value ($x_2$, $y_2$) are determined. As being illustrated in FIG. 3, when A phase is set as a y coordinate value, B phase forms 120 degree electric phase difference with the A phase as disclosed in FIG. 3. Therefore, the angle formed by B phase and the x axis becomes 30 degree. Accordingly, the coordinate values of A phase and B phase can be represented as the following formula.

$$x_1=0, y_i=h_A$$

$$x_2=h_B\cos(30°), y_2=h_B\sin(30°) \quad (1)$$

From thus obtained coordinate values of A and B phases, summed coordinate value can be determined. The summed coordinate value refers to $P(x_1+x_2, y_1+y_2)$. The angle ($\theta$) formed by the coordinate value P with the x axis can be obtained by the following math formula (2):

$$\theta = \tan^{-1}\left(\frac{Y1+Y2}{X1+X2}\right) \times \frac{180}{\pi} \quad (2)$$

$$\theta = |\theta|, 0° \le \theta < 90°$$

The angle obtained from the formula (2) provides information on a relative quantity of change in a motor. From the obtained angle value from the formula (2), the absolute value thereof is taken so as to place the angle in the first quadrant. Then, after checking out which quadrant the actual angle value ($\theta$) formed with the x axis belongs to, the actual angle value is determined by the following formula (3):

if $x_1+x_2>0$ and $y_1+y_2>0$ then $\theta=\theta$ if $x_1+x_2<0$ and $y_1+y_2>0$ then $\theta=180-\theta$ if $x_1+x_2<0$ and $y_1+y_2<0$ then $\theta=180+\theta$ if $x_1+x_2>0$ and $y_1+y_2<0$ then $\theta=360-\theta$ \quad (3)

In the above formula (3), when $\theta=\theta$, it is located in the first quadrant; when $\theta=180-\theta$, it is located in the second quadrant; when $\theta=180+\theta$, it is located in the third quadrant; and $\theta=360-\theta$, it is located in the fourth quadrant.

Regarding the coordinate value obtained through the formula (3), it should be taken into account that although the actual movement angle of a motor is small in the boundary of quadrant, the quantity of angle change relative to a time change appears to be large, therefore when differentiation, it could be calculated as an abnormally large value, not the actual speed value. In order to prevent such problem, it is possible to calculate the actual displacement value of a motor even at a boundary by the following formula (4).

if abs($\theta(k-1)-\theta(k))$)>180 then $\theta(k-1)-\theta(k)=(abs(\theta(k-1)-\theta(k))-360)\times(\theta(k-1)-\theta(k))/$
abs($\theta(k-1)-\theta(k)$) \quad (4)

It is possible to obtain a speed signal by dividing the final angular displacement value ($\Delta\theta$) of a motor obtained from the formula (4) by the rate of time change ($\Delta T$). In the formula (4), abs refers to the absolute value; k−1 refers to a previous sampling time; and k is a sampling time at present.

FIG. 4 is a flow chart showing an algorithm embodying the rotation speed signal of a motor by using a linear Hall-effect sensor of the present invention.

As it has been already mentioned in describing FIG. 3, in the step of S10, by using a Hall signal in the form of a sine wave of a linear Hall-effect sensor, coordinate values on an x-y coordinate system of the position sensor are determined.

Subsequently, in S20, summed coordinate values of the above determined coordinate values are calculated. The, in S30, the angle (θ) formed by a summed coordinate value resulted from the formula (2) and the x axis is calculated. In S40, by the formula (3), the quadrant of the angle (θ) formed with the x axis is determined. The step of determining the quadrant of the angle (θ) in S40, further comprises the step of determining the quantity of displacement at the boundary area of each quadrant, by using the formula (4). In S50, finally, a speed signal is determined by dividing the ultimate displacement value of a motor by the rate of time change.

FIGS. 5 to 10 represent the test results, wherein a linear Hall-effect sensor is applied in the tests.

In FIGS. 5 to 9, the test results, wherein a motor rotates at a constant speed in the tests, are represented to compare the speed signal of a motor using a linear Hall-effect sensor of the present invention with a conventional speed signal. As seen from the test results, it can be known that the speed signal value of the present invention and that of a conventional speed sensor are similar.

In the meantime, FIG. 10 shows the result of a test in which the speed of a motor is changed from lower speed to higher speed. As seen from the result, it can be known that the speed signal values of a motor according to the present invention are very good, not only at higher speed but also at lower speed. However, from FIG. 10, it can be also clearly seen that noises appear in the speed signals of a conventional signal sensor, when it rotates at a counterclockwise rotation, owing to the poor contact between a brush and a commutator at the time of clockwise/counterclockwise rotation of the motor.

INDUSTRIAL AVAILABILITY

According to the present invention:

firstly, it is possible to apply the present invention to a motor-driven system which has a narrow development space, by eliminating a speed sensor and thus ensuring a development space;

secondly, it is possible to be applied to a BLDC motor for high-speed use by using a non-contact type sensor, and to achieve perfect realization of speed signal even at lower speed, thereby being possible to detect a speed over an extensive speed range;

thirdly, it is possible to embody a speed sensor with high reliability as compared to a conventional tachometer which has been mainly used for obtaining speed information. In a tachometer, there are some cases wherein the sensitivity of a sensor changes according to the state of contact between a brush and a commutator, owing to the variation of contact resistance generated by such contact between a brush which has the same structure with that of a DC motor and a commutator. In the meantime, according to the method of the present invention, it is possible to ensure higher reliability through the realization of a speed signal by using a non-contact type linear Hall-effect sensor which varies its output voltage depending on the intensity of a surrounding magnetic field.

Further, since the present invention uses two Hall signals in a speed signal realization algorithm using changes in magnetic field in response to displacement of a rotor in a motor, it is possible to calculate the rotation angle of a motor by using the phase difference in the Hall signals and trigonometric function, and to measure an actual speed value of a motor through the changes in the rotation angle of a motor relative to time change.

So far, the present invention has been described with referring to certain example of the present invention, however, the present invention is by no means limited by such example. Further, the present invention may be practiced by an ordinarily skilled person in the art as being further modified or varied.

What is claimed is:

1. A realization method of a speed signal of a motor using a linear Hall-effect sensor, comprising the steps of:
   determining coordinate values on an x-y coordinate system using a Hall signal in the form of a sine wave of the linear Hall-effect sensor;
   evaluating a summed coordinate value of the above coordinate values;
   calculating the angle (θ) formed by a summed coordinate value and the x axis;
   determining the quadrant of the resulted angle (θ); and
   determining a speed signal by dividing the final motor displacement value by the rate of time change.

2. The realization method of speed signal of a motor according to claim 1, wherein the step of determining the quadrant of the angle (θ) further comprises a step of determining displacement at a boundary area of each quadrant.

3. The realization method of speed signal of a motor according to claim 1, wherein the angle (θ) formed by the summed coordinate value and the x axis is obtained by the following formula:

$$\theta = \tan^{-1}\left(\frac{Y1+Y2}{X1+X2}\right) \times \frac{180}{\pi}$$

$$\theta = |\theta|, 0° \leq \theta < 90°$$

wherein, $y_1+y_2$ represents y coordinate value of two optional Hall signals in the xy plane, and $x_1+x_2$ represents x coordinate value of two optional Hall signals in the xy plane.

4. The realization method of speed signal of a motor according to claim 1, wherein the resulted angle (θ) in the boundary of quadrant is determined by the following formula:

if abs(θ(k−1)−θ(k)))>180 then

θ(k−1)−θ(k)=abs(θ(k−1)−θ(k))−360×(θ(k−1)−θ(k))/abs(θ(k−1)−θ(k))

wherein, k is sampling time at present, and k−1 is previous sampling time.

5. The realization method of speed signal of a motor according to claim 1, wherein the motor is a brushless DC motor.

6. The realization method of speed signal of a motor according to claim 5, wherein the brushless DC motor further comprises a shaft, a stator, an armature coil, rotor yoke, ball bearing, a linear Hall-effect sensor, a stator yoke, a magnet and a bearing bracket.

* * * * *